United States Patent
Lin (10) Patent No.: US 9,385,037 B2
(45) Date of Patent: Jul. 5, 2016

(54) SEMICONDUCTOR ARRANGEMENT COMPRISING METAL CAP AND DIELECTRIC LAYER DEFINING AIR GAP

(71) Applicant: Taiwan Semiconductor Manufacturing Company Limited, Hsin-Chu (TW)

(72) Inventor: Hsiang-Wei Lin, New Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/254,046

(22) Filed: Apr. 16, 2014

(65) Prior Publication Data

US 2015/0303140 A1    Oct. 22, 2015

(51) Int. Cl.
*H01L 23/52* (2006.01)
*H01L 21/768* (2006.01)
*H01L 21/764* (2006.01)
*H01L 23/522* (2006.01)
*H01L 23/532* (2006.01)
*H01L 23/528* (2006.01)

(52) U.S. Cl.
CPC ........ *H01L 21/76895* (2013.01); *H01L 21/764* (2013.01); *H01L 23/5222* (2013.01); *H01L 23/53295* (2013.01); *H01L 23/5283* (2013.01)

(58) Field of Classification Search
CPC ............ H01L 21/768; H01L 21/76834; H01L 21/76849; H01L 21/7685; H01L 21/76879; H01L 21/76888; H01L 23/5226; H01L 23/53223; H01L 23/53238; H01L 21/76837; H01L 21/76877; H01L 23/5222; H01L 23/53295
USPC .................................. 257/773–774
See application file for complete search history.

(56) References Cited

U.S. PATENT DOCUMENTS

| | | | |
|---|---|---|---|
| 2005/0170632 A1* | 8/2005 | Shim ................ | H01L 21/76852 438/622 |
| 2007/0052101 A1* | 3/2007 | Usami .............. | H01L 21/76801 257/758 |
| 2010/0052178 A1* | 3/2010 | Meinhold ........ | H01L 21/76834 257/773 |
| 2012/0038037 A1* | 2/2012 | Chen ................. | H01L 21/7682 257/734 |
| 2015/0037980 A1* | 2/2015 | Rha .................... | H01L 21/306 438/700 |

* cited by examiner

*Primary Examiner* — Dung Le
(74) *Attorney, Agent, or Firm* — Cooper Legal Group, LLC (57) ABSTRACT

One or more semiconductor arrangements are provided. A semiconductor arrangement includes a first dielectric layer defining a first recess, a first contact in the first dielectric layer, a first metal cap over at least part of the first contact and a second dielectric layer over the first dielectric layer within the first recess and defining an air gap proximate the first contact.

20 Claims, 10 Drawing Sheets

SEMICONDUCTOR ARRANGEMENT COMPRISING METAL CAP AND DIELECTRIC LAYER DEFINING AIR GAP

BACKGROUND

Contacts are used to make electrical connections in or among different features in a semiconductor arrangement. A contact, for example, is used to connect one metal layer to another metal layer, where the metal layers are otherwise electrically isolated from one another, such as by an insulating or dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of a device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and one or more methods for forming such semiconductor arrangements are provided herein. In some embodiments, a semiconductor arrangement includes a metal cap is over a contact. In some embodiments, the metal cap has an extension region that facilitates the formation of an air gap in a recess proximate the contact. In some embodiments, the metal cap reduces the amount of a dielectric material deposited in the recess thereby facilitating the formation of the air gap. In some embodiments, given that air in the air gap has a different dielectric constant than the dielectric material, a capacitance developed between the contact the dielectric material having the air gap formed therein and another contact or conductive material is different than if the air gap was not present or if a smaller air gap was present. In some embodiments the capacitance is reduced due to the presence of the air gap. In some embodiments, a reduced capacitance enhances the performance of the semiconductor arrangement by reducing RC delays.

Figure 1:
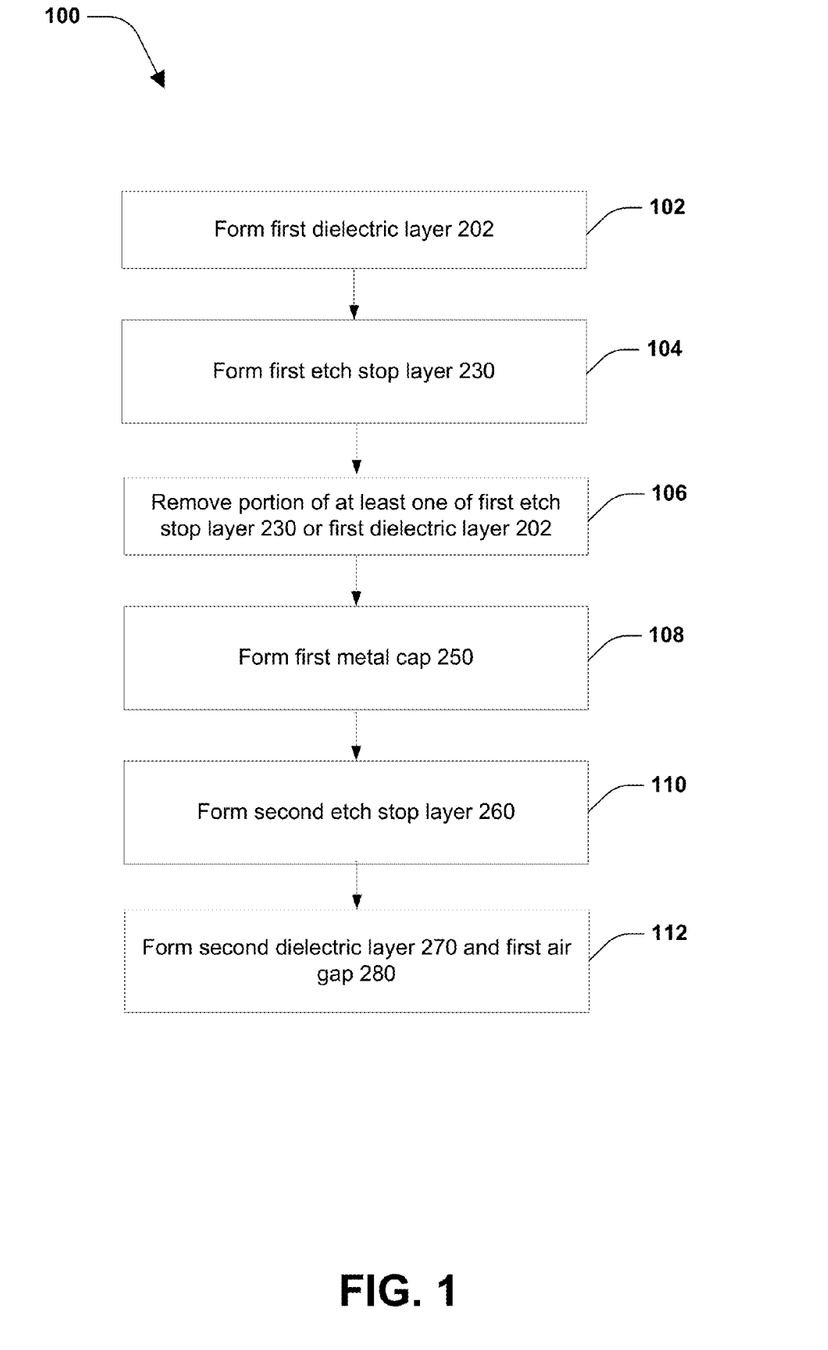
FIG. 1 is a flow diagram illustrating a method for fabricating a semiconductor arrangement, according to some embodiments.

Referring to FIG. 1, illustrated is a flow diagram of a method 100 for fabricating a semiconductor arrangement 200 according to some embodiments. Referring also to FIGS. 2 to 8, illustrated are cross-sectional views of the semiconductor arrangement 200 at various stages of fabrication according to some embodiments, such as according to the method 100 of FIG. 1. In some embodiments, at least some of the semiconductor arrangement 200 is fabricated as part of a CMOS process flow. In some embodiments, additional processing occurs at least one of before, during or after the method 100 of FIG. 1.

Figure 2:
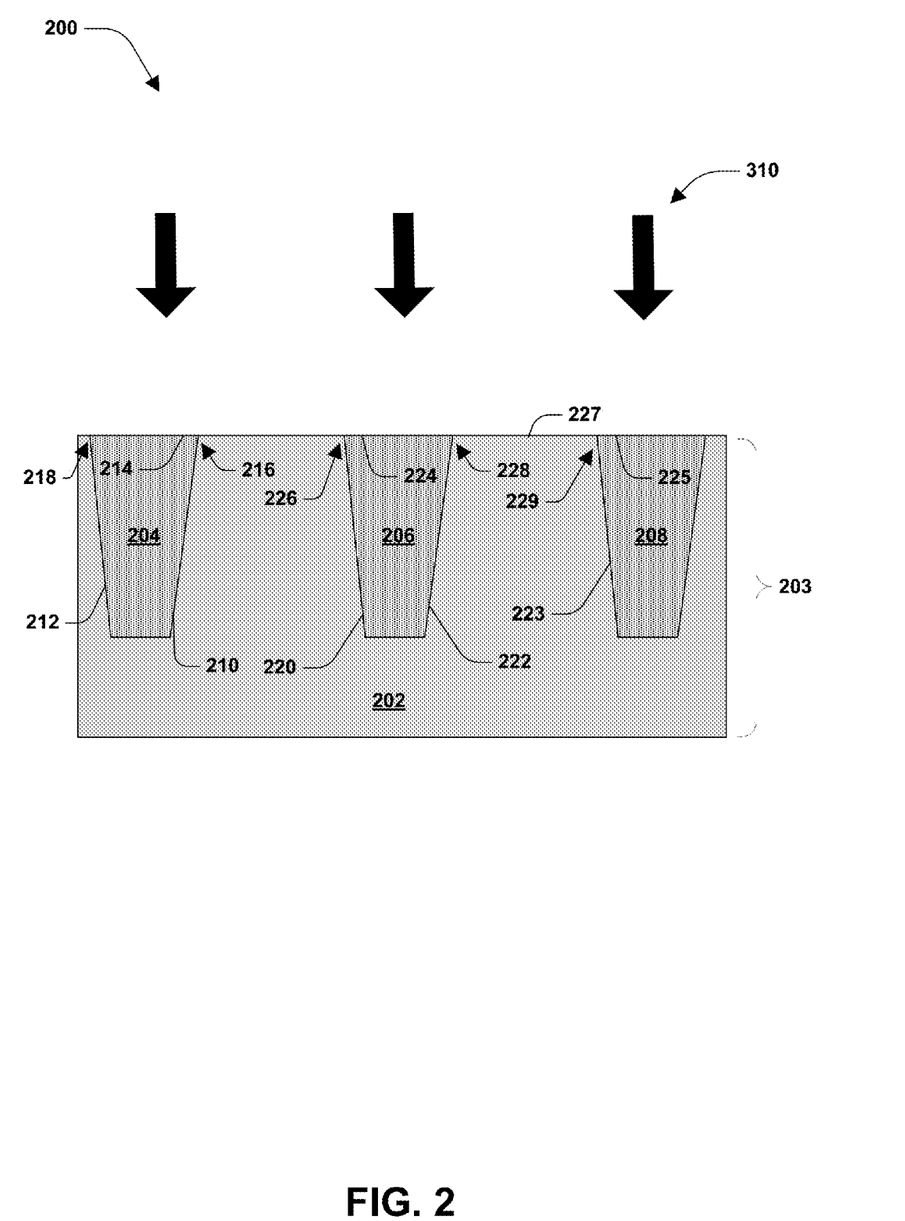
FIG. 2 is a cross-sectional view of a semiconductor arrangement during fabrication, according to some embodiments.

At 102, a first dielectric layer 202 is formed, as illustrated in FIG. 2. In some embodiments, the first dielectric layer 202 is merely provided or received and is not formed as part of method 100. In some embodiments, the first dielectric layer 202 includes a low K material. In some embodiments, the first dielectric layer 202 is an epitaxial layer. In some embodiments, the first dielectric layer 202 includes silicon. In some embodiments, the first dielectric layer 202 includes at least one of silicon germanium (SiGe), silicon carbide (SiC), silicon phosphorus carbide (SiPC) or silicon phosphorus (SiP). In some embodiments, the first dielectric layer 202 includes a metal. In some embodiments, the first dielectric layer includes at least one of germanium, gallium arsenide, gallium nitride or aluminum gallium indium phosphide. In some embodiments, the first dielectric layer 202 has a first thickness 203. In some embodiments, the first thickness 203 is about 100 angstroms to about 5000 angstroms.

In some embodiments, the first dielectric layer 202 surrounds at least one of a first contact 204, a second contact 206 or a third contact 208. In some embodiments, at least one of the first contact 204, the second contact 206 or the third contact 208 are formed within the first dielectric layer 202 such as by etching openings into the first dielectric layer 202 and then filling those openings with material of the contacts. In some embodiments, at least one of the first contact 204, the second contact 206 or the third contact 208 are initially formed such as by forming a layer of material of the contacts, patterning the layer of material and then forming the first dielectric layer 202 around the contacts. In some embodiments, at least one of the contacts 204-208 includes at least one of copper, tungsten or tin. In some embodiments, the first contact 204 includes at least one of a first sidewall 210, a second sidewall 212, a first contact top surface 214, a first corner 216 or a second corner 218. In some embodiments, the second contact 206 includes at least one of a third sidewall 220, a fourth sidewall 222, a second contact top surface 224, a third corner 226 or a fourth corner 228. In some embodiments, the third contact 208 includes at least one of a fifth sidewall 223, a third contact top surface 225 or a fifth corner 229.

In some embodiments, the first dielectric layer 202 is formed by a first process 310. In some embodiments, the first process 310 includes at least one of a plasma enhanced chemical vapor deposition (PECVD) process, a chemical vapor deposition (CVD) process, an atomic layer deposition (ALD), a physical vapor deposition process (PVD), an epitaxy process or a spin-on process. In some embodiments, the first dielectric layer 202 is grown by at least one of solid-phase epitaxy (SPE) or vapor-phase epitaxy. In some embodiments, the first process 310 includes a chemical mechanical planarization (CMP) process. In some embodiments, the CMP process planarizes a top surface 227. In some embodiments, the top surface 227 includes a part of at least one the contacts 204-208 or the first dielectric layer 202.

Figure 3:
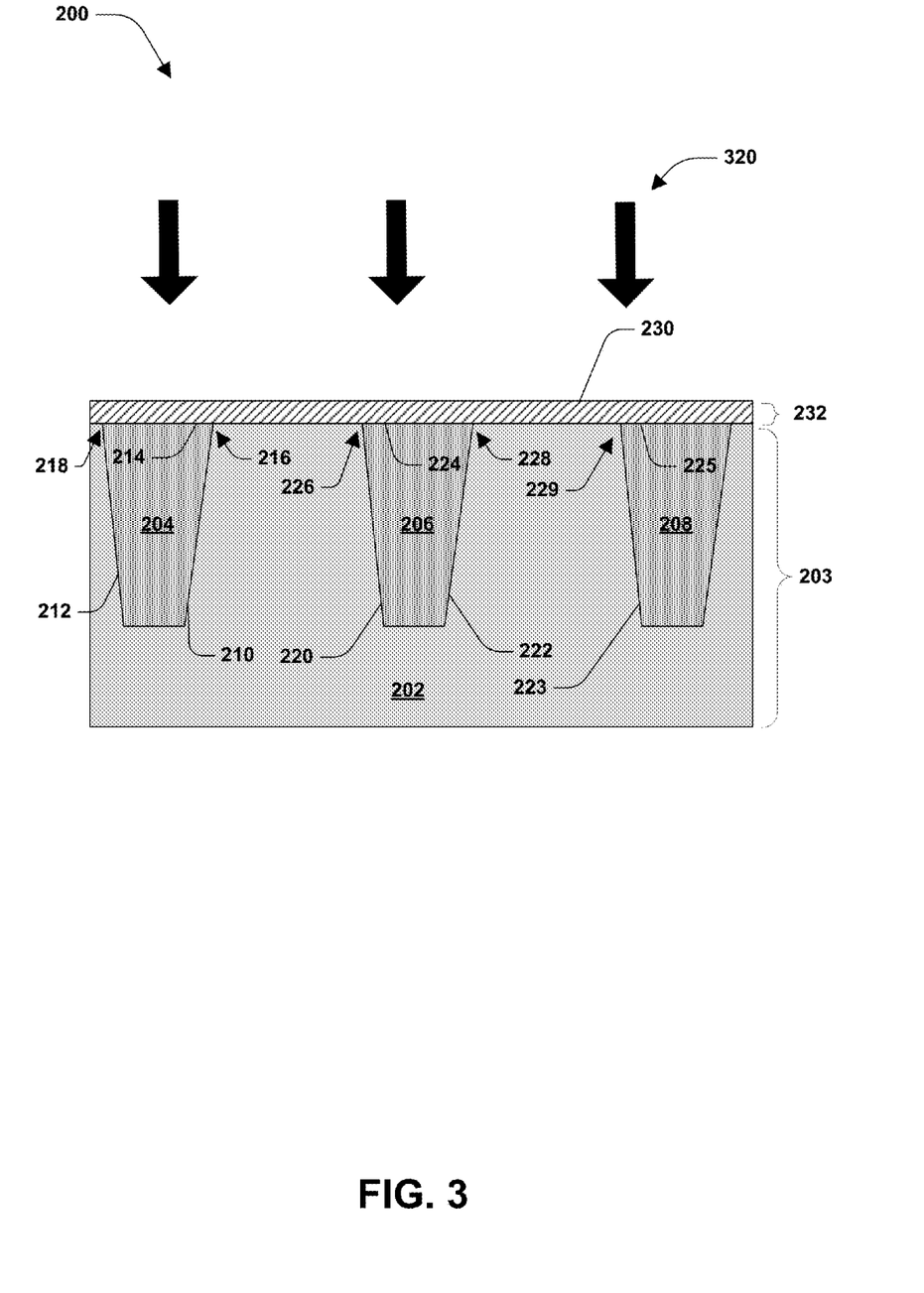
FIG. 3 is a cross-sectional view of a semiconductor arrangement during fabrication, according to some embodiments.

At 104, a first etch stop layer 230 is formed, as illustrated in FIG. 3. In some embodiments, the first etch stop layer 230 is formed over at least part of the top surface 227. In some embodiments, the first etch stop layer 230 stops an etching process from etching at least a part of the first dielectric layer 202. In some embodiments, the first etch stop layer 230 includes a dielectric material having a different etch selectivity from the first dielectric layer 202. In some embodiments, the first etch stop layer 230 includes at least one of silicon or aluminum. In some embodiments, the first etch stop layer 230 includes at least one of SiC, SiN, SiCN, SiCO, or CN. In some embodiments, the first etch stop layer 230 has a second thickness 232. In some embodiments, the second thickness 232 is about 10 angstroms to about 500 angstroms. In some embodiments, the first etch stop layer 230 is formed by a second process 320. In some embodiments, the second process 320 includes at least one of a plasma enhanced chemical vapor deposition (PECVD) process, a chemical vapor deposition (CVD) process, an atomic layer deposition (ALD), a physical vapor deposition process (PVD), an epitaxy process or a spin-on process.

Figure 4A:
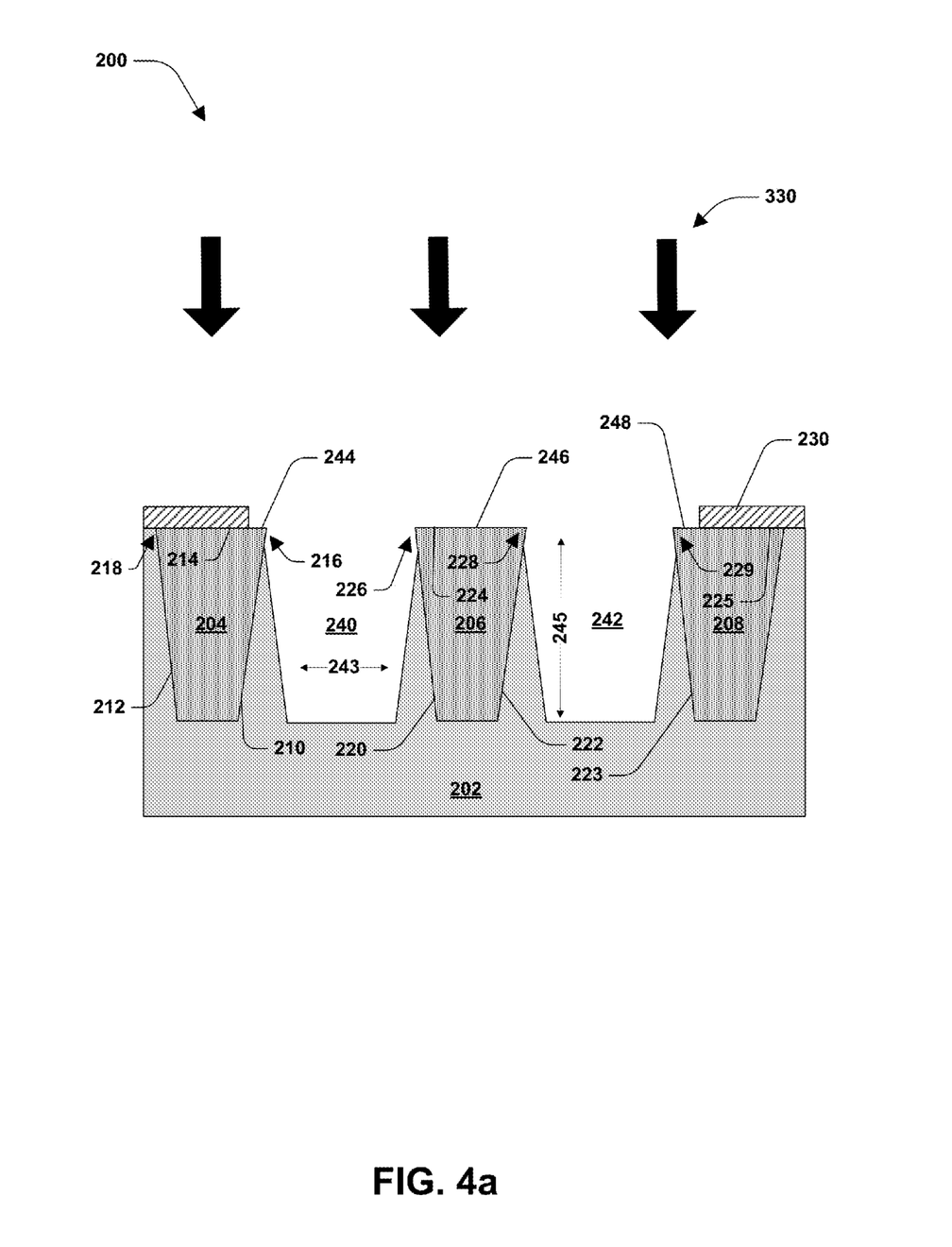
FIG. 4a is a cross-sectional view of a semiconductor arrangement during fabrication, according to some embodiments.

At 106, a portion of at least one of the first etch stop layer 230 or the first dielectric layer 202 is removed, as illustrated in FIG. 4a. In some embodiments, a first recess 240 is formed by removing a first portion of at least one of the first dielectric layer 202 or the first etch stop layer 230. In some embodiments, a second recess 242 is formed by removing a second portion of at least one of the first dielectric layer 202 or the first etch stop layer 230. In some embodiments, the first recess 240 is formed between the first contact 204 and the second contact 206. In some embodiments, the second recess 242 is formed between the second contact 206 and the third contact 208. In some embodiments, at least one of the recesses 240-242 has a first width 243. In some embodiments, the first width 243 is about 100 angstroms to about 4000 angstroms. In some embodiments, at least one of the recesses 240-242 has a first depth 245. In some embodiments, the first depth 245 is about 100 angstroms to about 5000 angstroms.

In some embodiments, a third portion of at least one of the first dielectric layer 202 or the first etch stop layer 230 is removed to reveal a first exposed surface 244. In some embodiments, at least one of a second exposed surface 246 or a third exposed surface 248 is revealed by the removal of a fourth portion of at least one of the first dielectric layer 202 or the first etch stop layer 230. In some embodiments, at least one of the exposed surfaces 244-248 is proximate at least one of the first corner 216, the second corner 218, the third corner 226, the fourth corner 228 or the fifth corner 229. In some embodiments, at least one of the exposed surfaces 244-248 includes at least a part of the first sidewall 210, the second sidewall 212, the third sidewall 220, the fourth sidewall 222, the fifth sidewall 223, the first contact top surface 214, the second contact top surface 224 or the third contact top surface 225.

In some embodiments, at least one of the portions of at least one of the first dielectric layer 202 or the first etch stop layer 230 are removed by a third process 330. In some embodiments, the third process 330 includes at least one of a photolithography process, a lithography process, a wet clean process or an etch process.

Figure 4B:
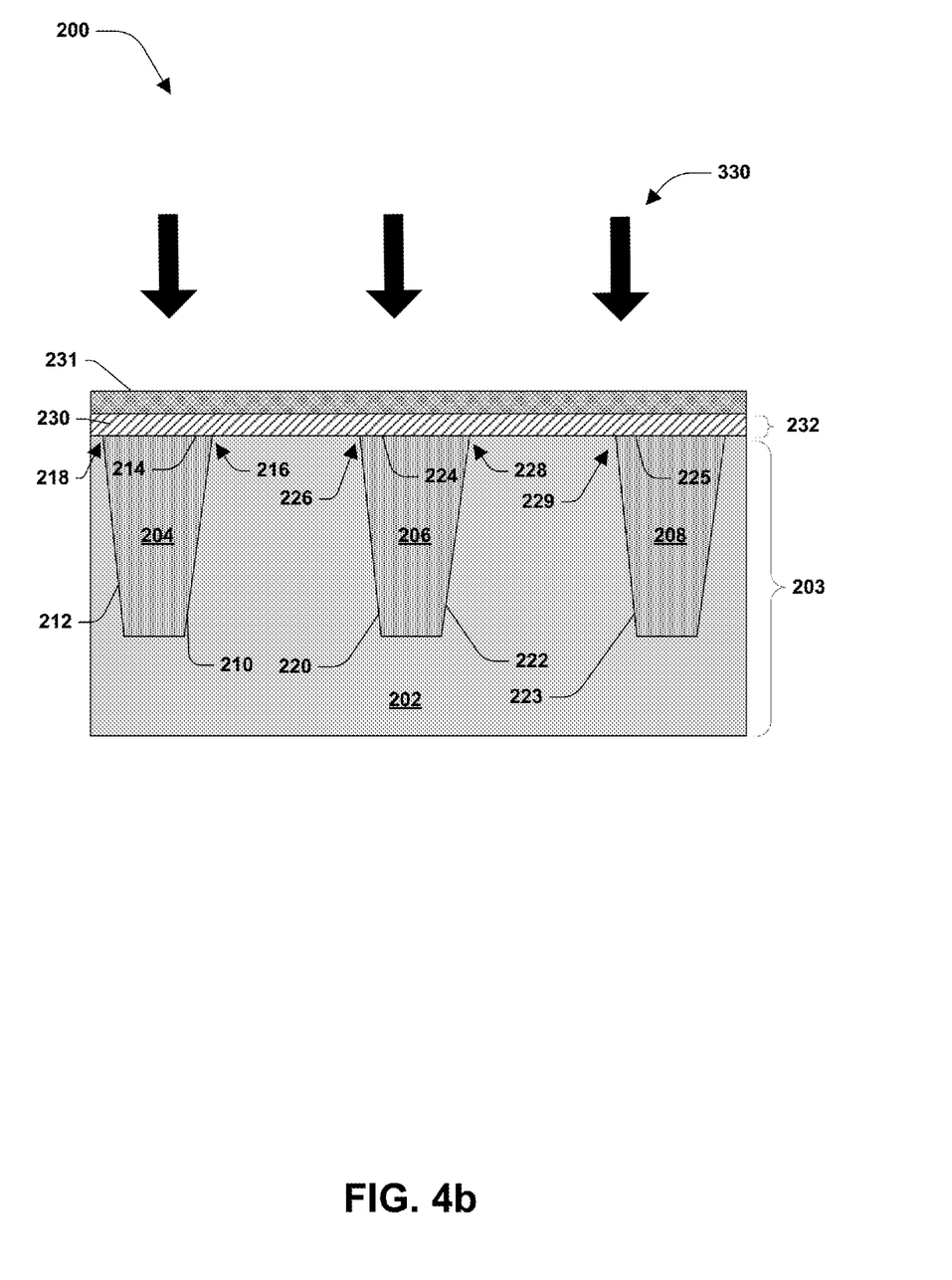
FIG. 4b is a cross-sectional view of a semiconductor arrangement during fabrication, according to some embodiments.

In some embodiments, the third process 330 includes forming a photoresist layer 231 before the etching process, as illustrated in FIG. 4b. In some embodiments, the photoresist layer 231 is formed over at least a portion of one of the first etch stop layer 230 or the first dielectric layer 202. In some embodiments, the photoresist layer 231 is formed by at least one of photolithography, immersion lithography, ion-beam writing, or other suitable processes. In some embodiments, the photolithography process includes at least one of spin coating, soft-baking, exposure, post-baking, developing, rinsing, drying, or other suitable process.

Figure 4C:
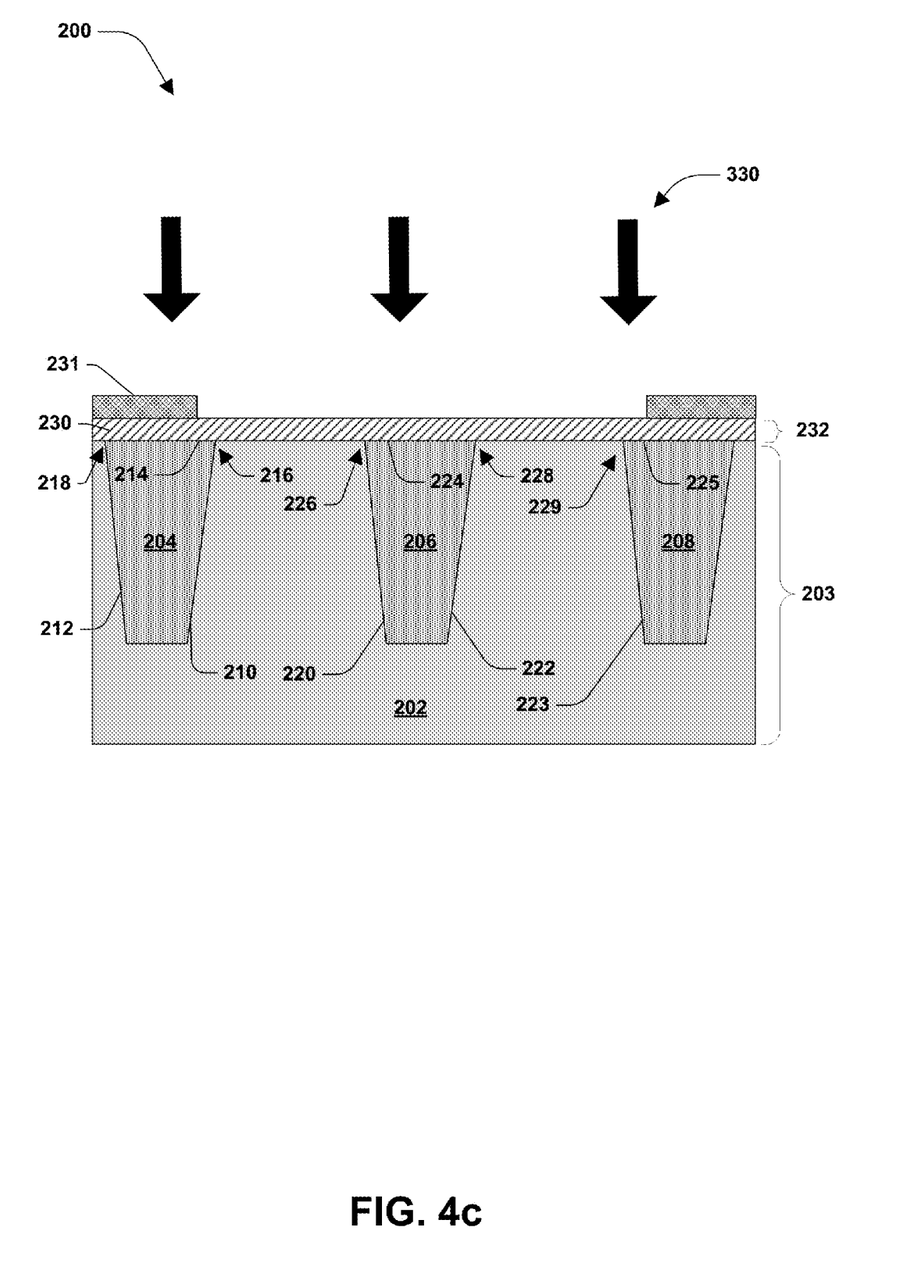
FIG. 4c is a cross-sectional view of a semiconductor arrangement during fabrication, according to some embodiments.

In some embodiments, the photolithography process includes exposing the photoresist layer 231, performing a post-exposure bake process, and developing the photoresist layer 231 to form a masking element from the photoresist layer 231, as illustrated in FIG. 4c. In some embodiments, the etch process is preformed with the masking element in place such that areas where the masking element has been removed are affected by the etch process. In some embodiments, the etch process forms at least one of the first recess 240, the second recess 242 or at least one of the exposed surfaces 244-248.

In some embodiments, the third process 330 includes at least one of a first etching process or a second etching process. In some embodiments, at least one of the etching processes includes at least one of a dry etch process or a wet etch process. In some embodiments, the dry etch process includes the use of at least one of $CF_4$, $SF_6$, or $NF_3$. In some embodiments, at least one of the etching processes includes at least one of a reactive ion etch (RIE) or a hydrofluoric acid (HF) etch. In some embodiments, the photoresist layer 231 is removed before, after or during at least one of the etching processes.

Figure 5:
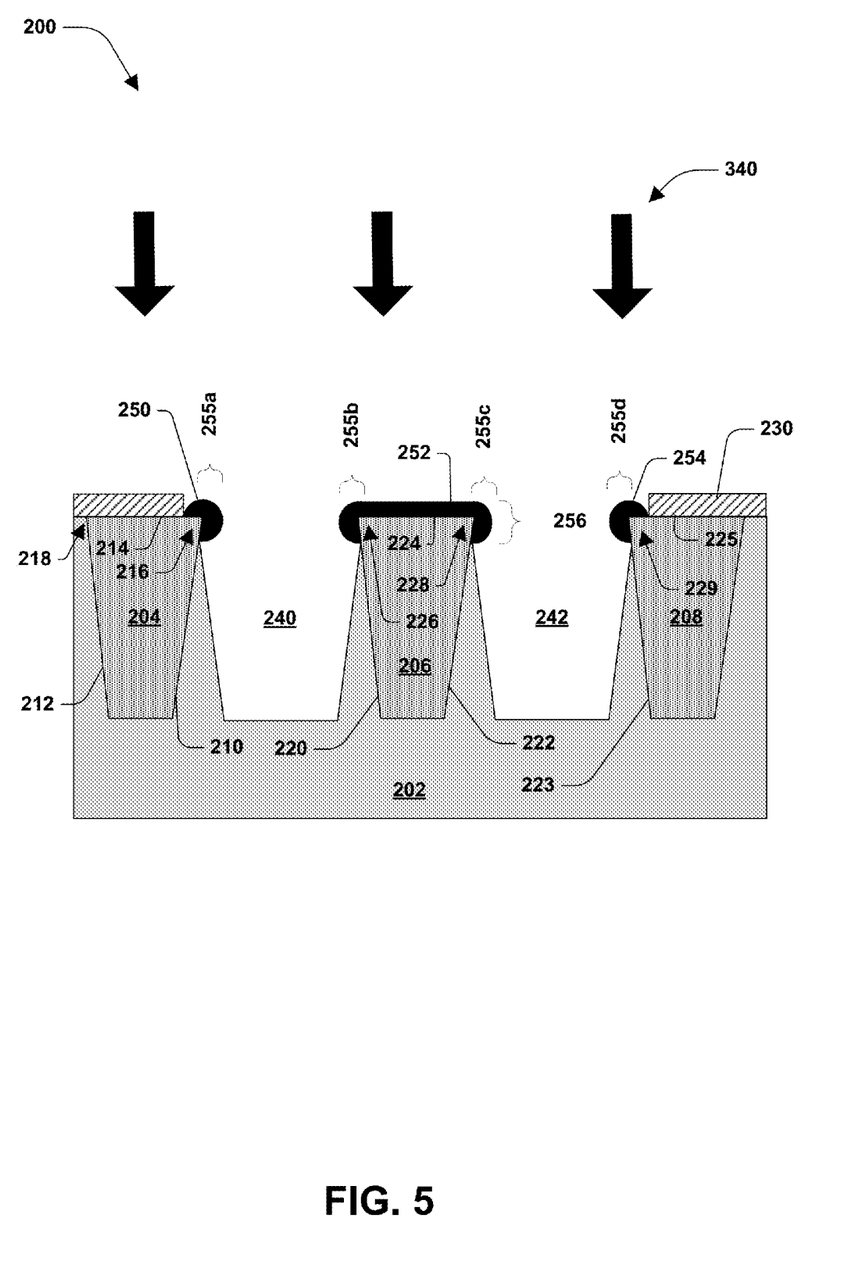
FIG. 5 is a cross-sectional view of a semiconductor arrangement during fabrication, according to some embodiments.

At 108, a first metal cap 250 is formed, as illustrated in FIG. 5. In some embodiments, the first metal cap 250 is formed on the first exposed surface 244. In some embodiments, at least one of a second metal cap 252 or a third metal cap 254 is formed on at least one of the second exposed surface 246 or the third exposed surface 248. In some embodiments, at least one of the metal caps 250-254 includes at least one of cobalt or aluminum. In some embodiments, at least one of the metal caps 250-254 includes a metal material having a higher deposition rate onto a metal than onto a dielectric material. In some embodiments, the metal material has a deposition rate onto metal that is thirty times greater than the deposition rate onto a dielectric material. In some embodiments, at least one of the metal caps 250-254 has a third thickness 256. In some embodiments, the third thickness 256 is about 10 angstroms to about 100 angstroms.

In some embodiments, at least one of the metal caps 250-254 includes at least one of extension regions 255a-255d. In some embodiments, the extension regions 255a-255d extend into at least one of the first recess 240 or the second recess 242. In some embodiments, at least one of the extension regions 255a-255d extend into at least one of the recesses 240-242 by about 10 angstroms to about 100 angstroms. In some embodiments, at least one of the metal caps 250-254 has an arched region proximate at least one of the first corner 216, the second corner 218, the third corner 226, the fourth corner 228 or the fifth corner 229. In some embodiments, at least one of the metal caps 250-254 cover the entirety of at least one of the first top surface 214, the second top surface 224 or the third top surface 225.

In some embodiments, at least one of the metal caps 250-254 is formed by a fourth process 340. In some embodiments, the fourth process 340 includes at least one of a plasma enhanced chemical vapor deposition (PECVD) process, a chemical vapor deposition (CVD) process, an atomic layer deposition (ALD), a physical vapor deposition process (PVD), an epitaxy process or a spin-on process. In some embodiments, the fourth process 340 includes depositing the metal material at a temperature of about 100° C. to about 400° C. In some embodiments, the fourth process includes depositing the metal material at a pressure of about 1 torr to about 40 torr. In some embodiments, the fourth process 340 includes depositing the metal material at a power of about 200 W to about 800 W.

Figure 6:
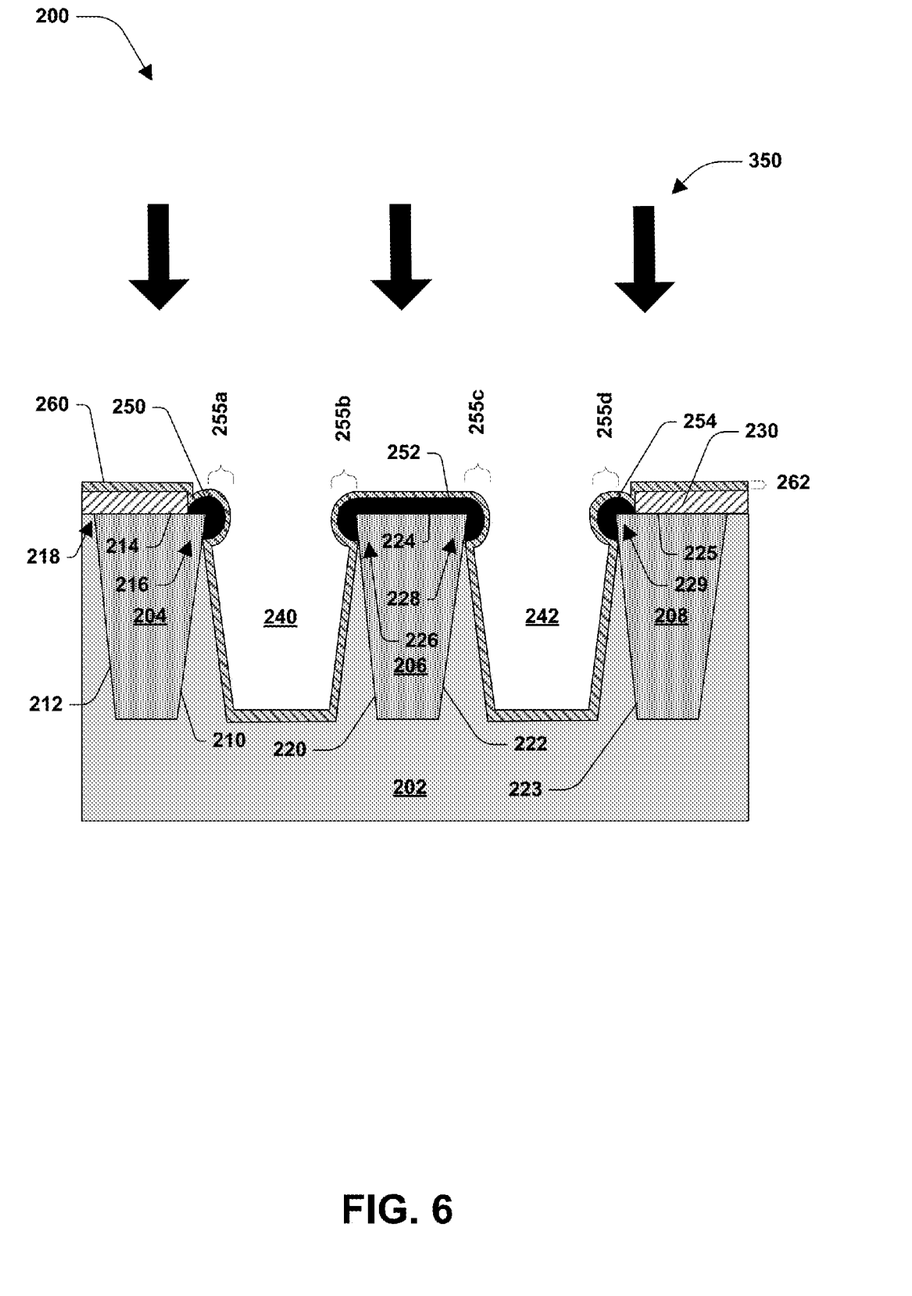
FIG. 6 is a cross-sectional view of a semiconductor arrangement during fabrication, according to some embodiments.

At 110, a second etch stop layer 260 is formed, as illustrated in FIG. 6. In some embodiments, the second etch stop layer 260 is formed over at least at least one of the metal caps 250-254, the first etch stop layer 230 or the first dielectric layer 202. In some embodiments, the second etch stop layer 260 acts as a barrier layer for at least one of the metal caps 250-254 or the first dielectric layer 202. In some embodiments, the second etch stop layer 260 includes a dielectric material. In some embodiments, the second etch stop layer 260 includes at least one of silicon or aluminum. In some embodiments, the second etch stop layer 260 includes at least one of SiC, SiN, SiCN, SiCO or CN. In some embodiments, the second etch stop layer 260 is formed by a fifth process 350. In some embodiments, the fifth process 350 includes at least one of a plasma enhanced chemical vapor deposition (PECVD) process, a chemical vapor deposition (CVD) process, an atomic layer deposition (ALD), a physical vapor deposition process (PVD), an epitaxy process or a spin-on process. In some embodiments, the second etch stop layer 260 has a fourth thickness 262. In some embodiments, the fourth thickness 262 is about 5 angstroms to about 100 angstroms.

Figure 7:
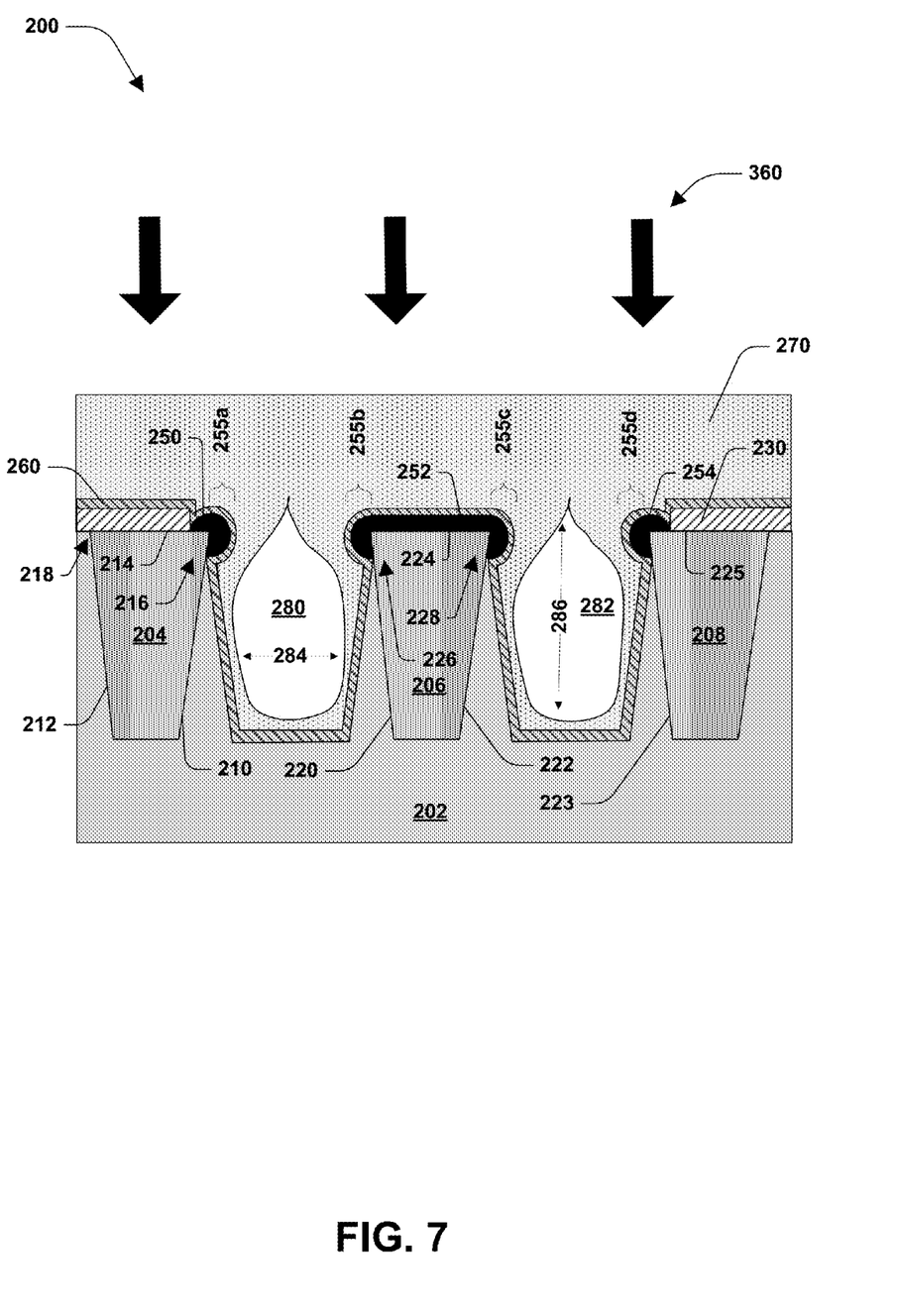
FIG. 7 is a cross-sectional view of a semiconductor arrangement during fabrication, according to some embodiments.

At 112, a second dielectric layer 270 is formed, as illustrated in FIG. 7. In some embodiments, the second dielectric layer 270 is formed by a sixth process 360. In some embodiments, the sixth process 360 includes at least one of a plasma enhanced chemical vapor deposition (PECVD) process, a chemical vapor deposition (CVD) process, an atomic layer deposition (ALD), a physical vapor deposition process (PVD), an epitaxy process or a spin-on process. In some embodiments, the second dielectric layer 270 is grown by at least one of solid-phase epitaxy (SPE) or vapor-phase epitaxy.

In some embodiments, the second dielectric layer 270 is formed over the first dielectric layer 202. In some embodiments, the second dielectric layer 270 is formed within at least one of first recess 240 or the second recess 242. In some embodiments, the formation of the second dielectric layer 270 within at least one of the recess 240-242 causes at least one of a first air gap 280 or a second air gap 282 to be formed therein. In some embodiments, at least one of the air gaps 280-282 is defined by the second dielectric layer 270. In some embodiments, at least one of the air gaps 280-282 is formed due to at least one of extension regions 255a-255d. In some embodiments, at least one of the extension regions 255a-255d causes the second dielectric layer 270 to relatively quickly pinch off during formation of the second dielectric layer 270. In some embodiments, the quick pinch off of the second dielectric layer 270 results in the formation of the air gaps 280-282 as less material is able to enter the recesses 240-242 before the recesses 240-242 close off at the top. In some embodiments, capacitive coupling is reduced in the semiconductor arrangement 200 as a result of the formation of at least one of the air gaps 280-282.

In some embodiments, at least one of the air gaps 280-282 has a second width 284. In some embodiments, the second width 284 is about 10 angstroms to about 2000 angstroms. In some embodiments, at least one of the air gaps 280-282 has a first height 286. In some embodiments, the first height 286 is about 10 angstroms to about 5000 angstroms. In some embodiments, at least one of the air gaps 280-282 is proximate at least one of the first sidewall 210, the third sidewall 220, the fourth sidewall 222 or the fifth sidewall 223. In some embodiments, at least one of the air gaps 280-282 is about 10 angstroms to about 500 angstroms away from at least one of the first sidewall 210, the third sidewall 220, the fourth sidewall 222 or the fifth sidewall 223. In some embodiments, at least one of the air gaps 280-282 has at least one of a trapezoidal shape, a tear drop shape or a width to height aspect ratio of about 0.5 to about 1. In some embodiments, a width to height aspect ratio corresponds to a width of an air gap, such as 284, divided by a height of the air gap, such as 286.

In some embodiments, the semiconductor arrangement 200 includes other layers or features not specifically illustrated including at least one of a buried layer, a capping layer, a third dielectric layer, an interfacial layer, a gate stack, a gate dielectric layer, a poly gate layer, a source region, a drain region, an interconnect or other suitable features. In some embodiments, other back end of line (BEOL) processes are preformed on the semiconductor arrangement 200.

Figure 8:
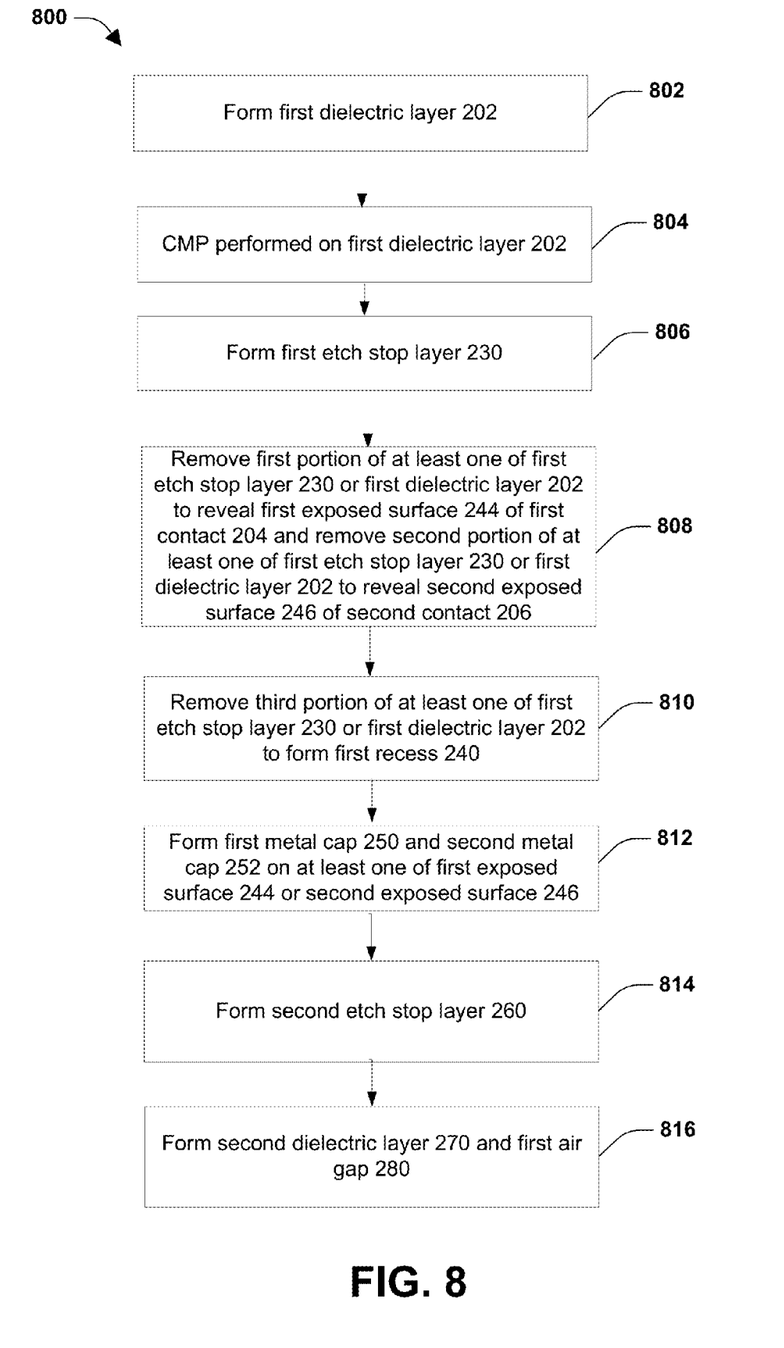
FIG. 8 is a flow diagram illustrating a method for fabricating a semiconductor arrangement, according to some embodiments.

Referring to FIG. 8, illustrated is a flow diagram of a method 800 for fabricating a semiconductor arrangement according to some embodiments. In some embodiments, at least some of the semiconductor arrangement is fabricated as part of a CMOS process flow. In some embodiments, additional processing occurs at least one of before, during or after the method 800 of FIG. 8. In some embodiments, certain actions and features in method 800 correspond to like actions and features in method 100, such as having the same or similar properties, dimensions, composition, etc.

At 802, a first dielectric layer 202 is formed. In some embodiments, at least one of a first contact 204 or a second contact 208 is present in the first dielectric layer 202. At 804, a chemical mechanical planarization (CMP) is performed on the first dielectric layer 202. In some embodiments, the CMP is performed on a top surface 227. In some embodiments, the CMP planarizes the top surface 227 of the first dielectric layer 202. At 806, a first etch stop layer 230 is formed. In some embodiments, the first etch stop layer 230 is formed over the top surface 227 of the first dielectric layer 202. At 808, a first portion of at least one of the first etch stop layer 230 or the first dielectric layer is removed to reveal a first exposed surface 244 of the first contact 204 and a second portion of at least one of the first etch stop layer 230 or the first dielectric layer 202 is removed to reveal a second exposed surface 246 of the second contact 206. In some embodiments, at least one of the first portion or the second portion is removed by a first etching process. At 810, a third portion of at least one of the first etch stop layer 230 or the first dielectric layer 202 is removed to form a first recess 240. In some embodiments, the first recess is formed by a second etching process. In some embodiments, at least one of the first portion, the second portion or the third portion are removed by the same etching process to form at least one of the first exposed surface 244, the second exposed surface 246 or the first recess 240. In some embodiments, the first recess 240 is formed between at least one of the first contact 204 and the second contact 206. At 812, a first metal cap 250 and a second metal cap 252 are formed over at least one of the first exposed surface 244 or the second exposed surface 244. In some embodiments, at least one of the metal caps 250-252 includes at least one extension region, such as extension regions 255a-255c. In some embodiments, at least one of the extension regions 255a-255c extends into the first recess 240. In some embodiments, at least one of the first metal cap 250 or the second metal cap 252 includes at least one of cobalt or aluminum. At 814, a second etch stop layer 260 is formed. In some embodiments, the second etch stop layer 260 is over at least one of the first metal cap 250, the second metal cap 252, the first dielectric layer 202 or the first etch stop layer 230. In some embodiments, the second etch stop layer 260 is a barrier layer that protects at least one of the first metal cap 250, the second metal cap 252, the first dielectric layer 202 or the first etch stop layer 230 from contamination. At 816, a second dielectric layer 270 is formed. In some embodiments, the second dielectric layer 270 is formed over at least one of the second etch stop layer 260, the first metal cap 250, the second metal cap 252, the first dielectric layer 202 or the first etch stop layer 230. In some embodiments, the second dielectric layer 270 is formed within the first recess 240. In some embodiments, a first air gap 280 is formed in the first recess 240 during the formation of the second dielectric layer 270. In some embodiments, at least one of the first metal cap 250 or the second metal cap 252 reduces the amount of a dielectric material deposited in the first recess 240 thereby facilitating the formation of the first air gap 280. In some embodiments a capacitance is reduced due to the presence of the first air gap 280. In some embodiments, a reduced capacitance enhances the performance of the semiconductor arrangement by reducing RC delay.

According to some aspects of the instant disclosure, a semiconductor arrangement is provided. The semiconductor arrangement comprises a first dielectric layer defining a first recess, a first contact in the first dielectric layer proximate the first recess, the first contact having a first contact top surface, a first sidewall and a second sidewall, a first metal cap over at least one of the first contact top surface, the first sidewall or the second sidewall and a second dielectric layer over the first dielectric layer within the first recess and defining an air gap proximate the first sidewall.

According to some aspects of the instant disclosure, a method of forming a semiconductor arrangement is provided. The method comprising forming a first metal cap on a first exposed surface of a first contact, the first metal cap having an extension region that extends into a first recess defined in a first dielectric layer and forming a second dielectric layer over the first dielectric layer within the first recess such that an air gap is defined within the second dielectric layer proximate the first contact due to the extension region.

According to some aspects of the instant disclosure, a method of forming a semiconductor arrangement is provided. The method comprising forming a first etch stop layer over at least one of a first dielectric layer or a first contact, removing a portion of at least one of the first etch stop layer or the first dielectric layer to reveal a first exposed surface of the first contact, forming a first metal cap on the first exposed surface of the first contact, the first metal cap having an extension region that extends into a first recess defined in the first dielectric layer, forming a second etch stop layer over at least one of the first etch stop layer, the first dielectric layer or the first metal cap and forming a second dielectric layer over the first dielectric layer within the first recess such that an air gap is defined within the second dielectric layer proximate the first contact due to the extension region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed as to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

It will be appreciated that layers, features, elements, etc. depicted herein are illustrated with particular dimensions relative to one another, such as structural dimensions or orientations, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first dielectric layer defining a first recess;
   a first contact in the first dielectric layer proximate the first recess, the first contact having a first contact top surface, a first sidewall and a second sidewall;
   a first metal cap over the first contact top surface and the first sidewall;
   a first etch stop layer over and in direct contact with the first metal cap and over and in direct contact with a sidewall of the first dielectric layer; and
   a second dielectric layer over the first dielectric layer within the first recess and defining an air gap proximate the first sidewall.

2. The semiconductor arrangement of claim 1, comprising:
   a second etch stop layer over at least one of the first dielectric layer or the first contact.

3. The semiconductor arrangement of claim 2, the second etch stop layer between the first etch stop layer and the first contact.

4. The semiconductor arrangement of claim 1, the first etch stop layer in direct contact with the second dielectric layer.

5. The semiconductor arrangement of claim 1, the first metal cap comprising:
   at least one of cobalt or aluminum.

6. The semiconductor arrangement of claim 1, wherein the first metal cap has an arched portion proximate a first corner of the first contact.

7. The semiconductor arrangement of claim 1, wherein the first metal cap comprises an extension region that extends into the first recess.

8. The semiconductor arrangement of claim 7, wherein the extension region extends into the first recess about 10 angstroms to about 100 angstroms.

9. The semiconductor arrangement of claim 1, the air gap having at least one of a width of about 10 angstroms to about 2000 angstroms or a height of about 10 angstroms to about 5000 angstroms.

10. The semiconductor arrangement of claim 1, the air gap having at least one of a trapezoidal shape, a tear drop shape or a width to height aspect ratio of about 0.5 to about 1.

11. A semiconductor arrangement, comprising:
    a first dielectric layer defining a first recess;
    a first contact having a first contact top surface and a first sidewall;
    a first metal cap in contact with a portion of the first contact top surface and a portion of the first sidewall; and
    a second dielectric layer disposed within the first recess and defining an air gap.

12. The semiconductor arrangement of claim 11, comprising an etch stop layer over a second portion of the first contact top surface.

13. The semiconductor arrangement of claim 12, the etch stop layer in contact with the second portion of the first contact top surface.

14. The semiconductor arrangement of claim 11, comprising:
    a second contact, the first contact diametrically opposing the second contact relative to the first recess and the first sidewall facing towards the second contact.

15. The semiconductor arrangement of claim 11, comprising:
    a second contact, the first contact diametrically opposing the second contact relative to the first recess and the second contact having a second contact top surface and a second sidewall; and
    a second metal cap in contact with a portion of the second contact top surface and a portion of the second sidewall.

16. The semiconductor arrangement of claim 11, the first dielectric layer laterally disposed between the first contact and the air gap.

17. The semiconductor arrangement of claim 11, comprising an etch stop layer in contact with the first metal cap.

18. The semiconductor arrangement of claim 11, comprising:
    a first etch stop layer over a second portion of the first contact top surface; and
    a second etch stop layer over the first etch stop layer and over the first metal cap.

19. The semiconductor arrangement of claim 18, the second etch stop layer in contact with the first etch stop layer and in contact with the first metal cap.

20. A semiconductor arrangement, comprising:
    a first dielectric layer defining a first recess;
    a first contact having a first contact top surface and a first sidewall, a first portion of the first sidewall in contact with the first dielectric layer;
    a first metal cap in contact with a portion of the first contact top surface and a second portion of the first sidewall; and
    a second dielectric layer disposed within the first recess and defining an air gap.

\* \* \* \* \*